(12) United States Patent
Kobayashi et al.

(10) Patent No.: US 10,121,746 B2
(45) Date of Patent: Nov. 6, 2018

(54) SEMICONDUCTOR DEVICE

(71) Applicant: Murata Manufacturing Co., Ltd., Kyoto (JP)

(72) Inventors: Kazuya Kobayashi, Kyoto (JP); Yuichi Sano, Kyoto (JP); Daisuke Tokuda, Kyoto (JP); Hiroaki Tokuya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/814,833

(22) Filed: Nov. 16, 2017

(65) Prior Publication Data

US 2018/0145028 A1    May 24, 2018

(30) Foreign Application Priority Data

Nov. 22, 2016  (JP) ................. 2016-227019

(51) Int. Cl.
*H01L 23/48*  (2006.01)
*H01L 23/528*  (2006.01)
*H01L 23/522*  (2006.01)
*H01L 23/532*  (2006.01)

(52) U.S. Cl.
CPC ...... *H01L 23/5283* (2013.01); *H01L 23/5226* (2013.01); *H01L 23/53295* (2013.01)

(58) Field of Classification Search
None
See application file for complete search history.

(56) References Cited

U.S. PATENT DOCUMENTS

| 5,686,760 A * | 11/1997 | Miyakawa | H01L 21/76843 257/751 |
| 7,915,737 B2 * | 3/2011 | Nakasato | H01L 23/3114 257/775 |
| 2001/0013656 A1 * | 8/2001 | Satou | H01L 23/5283 257/751 |
| 2016/0093566 A1 * | 3/2016 | Ting | H01L 23/5226 257/774 |

FOREIGN PATENT DOCUMENTS

JP        H07-153756 A       6/1995

* cited by examiner

*Primary Examiner* — Hung Vu
(74) *Attorney, Agent, or Firm* — Pearne & Gordon LLP

(57) ABSTRACT

A semiconductor device includes a semiconductor substrate, a first metal layer, an insulation layer, an organic layer, and a second metal layer. The first metal layer, the insulation layer, the organic layer, and the second metal layer are sequentially stacked on a surface of the semiconductor substrate. The first metal layer and the second metal layer are electrically connected to each other through vias formed in the insulation layer and the organic layer. The second metal layer includes an electrode pad at a position corresponding to the positions of the vias. At the interface between the surface of the semiconductor substrate and the first metal layer, a patch portion having a trapezoidal cross-sectional shape is disposed directly below the vias.

7 Claims, 3 Drawing Sheets

SEMICONDUCTOR DEVICE

This application claims priority from Japanese Patent Application No. 2016-227019 filed on Nov. 22, 2016. The content of this application is incorporated herein by reference in its entirety.

BACKGROUND OF THE DISCLOSURE

1. Field of the Disclosure

The present disclosure relates to a semiconductor device in which an organic insulation layer is formed on or over a semiconductor substrate.

2. Description of the Related Art

Semiconductor devices in which an insulation layer is formed on or over a surface of a semiconductor substrate are generally known (see, for example, Japanese Unexamined Patent Application Publication No. 7-153756 (Patent Document 1)). The semiconductor device described in Patent Document 1 includes a semiconductor substrate and an interlayer insulation film formed over a surface of the semiconductor substrate. The interlayer insulation film is interposed between a lower wiring layer and an upper wiring layer, and the lower wiring layer and the upper wiring layer are electrically connected to each other through a through-hole formed in the interlayer insulation film.

If an electrode pad, which is a part of the upper wiring layer, is formed at a position where the through-hole is filled, a depression may be formed in the electrode pad due to the through-hole. When wire bonding is performed on such an electrode pad, poor connection may occur due to the depression. As a result, a problem arises in that decrease of the mechanical strength in connecting between a wire and the electrode pad and increase of the electrical resistance between the wire and the electrode pad may occur.

Patent Document 1 also describes a structure in which a dummy pattern for improving step coverage is disposed directly below the through-hole. However, the dummy pattern is used to flatten the interlayer insulation film, which is made of an inorganic material and has a small thickness. Therefore, for example, an insulation film that is made of an organic material and has a large thickness is not taken into consideration, and, if an electrode pad is formed so as to fill a deep through-hole, the dummy pattern may not be capable of flattening the electrode pad.

In addition, the dummy pattern described in Patent Document 1 has a quadrangular cross-sectional shape. In this case, when a metal layer or an insulation layer is formed so as to cover the dummy pattern, the metal layer or the insulation layer is not likely to be appropriately formed at a corner of the quadrangular cross-sectional shape, and a problem arises in that reliability tends to decrease.

BRIEF SUMMARY OF THE DISCLOSURE

An object of the present disclosure, which has been devised to address the problem of existing technology, is to provide a semiconductor device that can reduce the poor connection of a wire and can increase its reliability.

According to preferred embodiments of the present disclosure, a semiconductor device includes a semiconductor substrate; and a first metal layer, an inorganic insulation layer, an organic insulation layer, and a second metal layer that are stacked on or over a surface of the semiconductor substrate. The organic insulation layer includes a hollow portion that is a through-hole or a blind hole. A patch portion that raises a bottom of the hollow portion is disposed in a region between the surface of the semiconductor substrate and the hollow portion of the organic insulation layer in a thickness direction. The patch portion has a trapezoidal cross-sectional shape, and an area of a bottom surface of the patch portion is larger than an area of an upper surface of the patch portion.

With the structure described above, since the patch portion can raise the bottom of the hollow portion, when the second metal layer is formed so as to fill the hollow portion, a depression in the surface of the second metal layer can be made shallower. Therefore, when wire bonding is performed on the second metal layer, the poor connection of a wire can be reduced. Moreover, since the patch portion has a trapezoidal cross-sectional shape, when a metal layer or an insulation layer is formed so as to cover the patch portion, the metal layer or the insulation layer can be formed without a gap, the occurrence of a defect in the metal layer or the insulation layer can be suppressed, and its reliability can be increased.

In the semiconductor device, an angle between a base and a lateral side of the trapezoidal cross-sectional shape of the patch portion may be in a range of 20° to 70°.

In this case, the angle of a corner of the patch portion is large. Therefore, when a metal layer or an insulation layer is formed so as to cover the patch portion, the occurrence of a defect in the metal layer or the insulation layer can be suppressed.

In the semiconductor device, the hollow portion may be a through-hole, and the area of the bottom surface of the patch portion may be larger than an opening area of the through-hole.

In this case, the entirety of the bottom of the through-hole can be raised. Therefore, a depression in the surface of the second metal layer can be made shallower in the entire region corresponding to the through-hole.

In the semiconductor device, the second metal layer may include an electrode pad having a surface exposed at a position corresponding to a position of the hollow portion of the organic insulation layer.

In this case, the surface of the electrode pad can be flattened. Therefore, the poor connection of a wire can be reduced when the wire bonding is performed on the electrode pad.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, semiconductor devices according to embodiments of the present disclosure will be described with reference to the drawings. Each of the semiconductor devices can be used, for example, as an electric power amplifier that amplifies a high-frequency signal having a frequency in, for example, a megahertz band or a gigahertz band.

Figure 1:
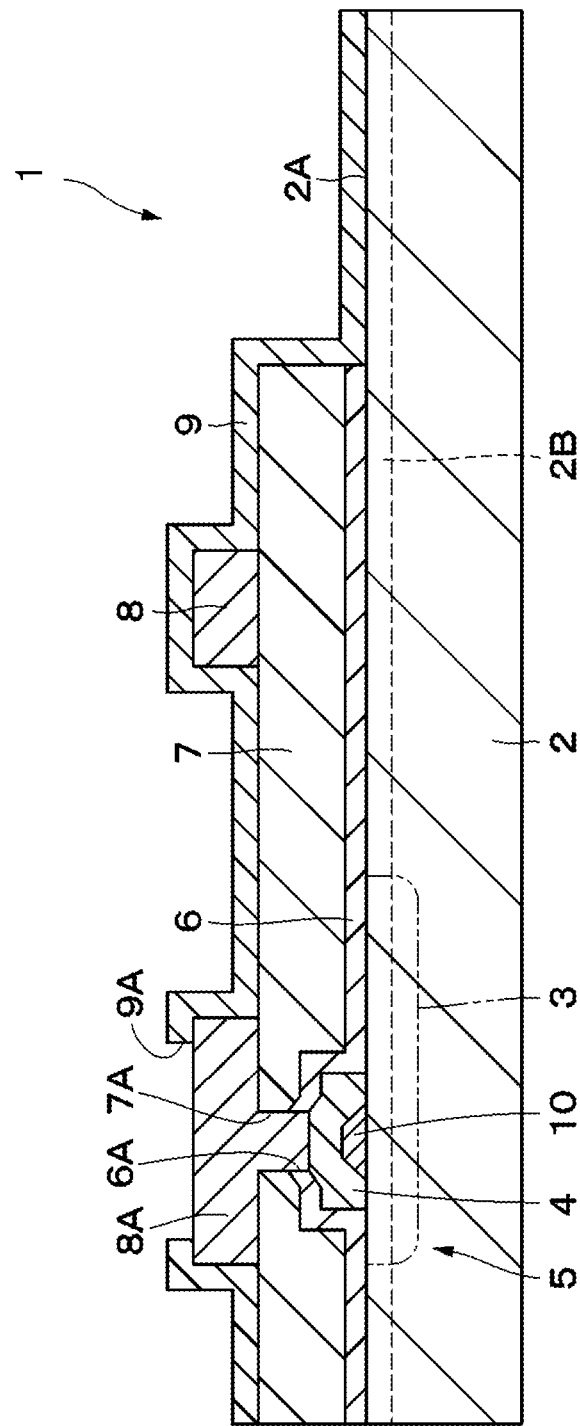
FIG. 1 is a sectional view of a semiconductor device according to a first embodiment.
Figure 2:
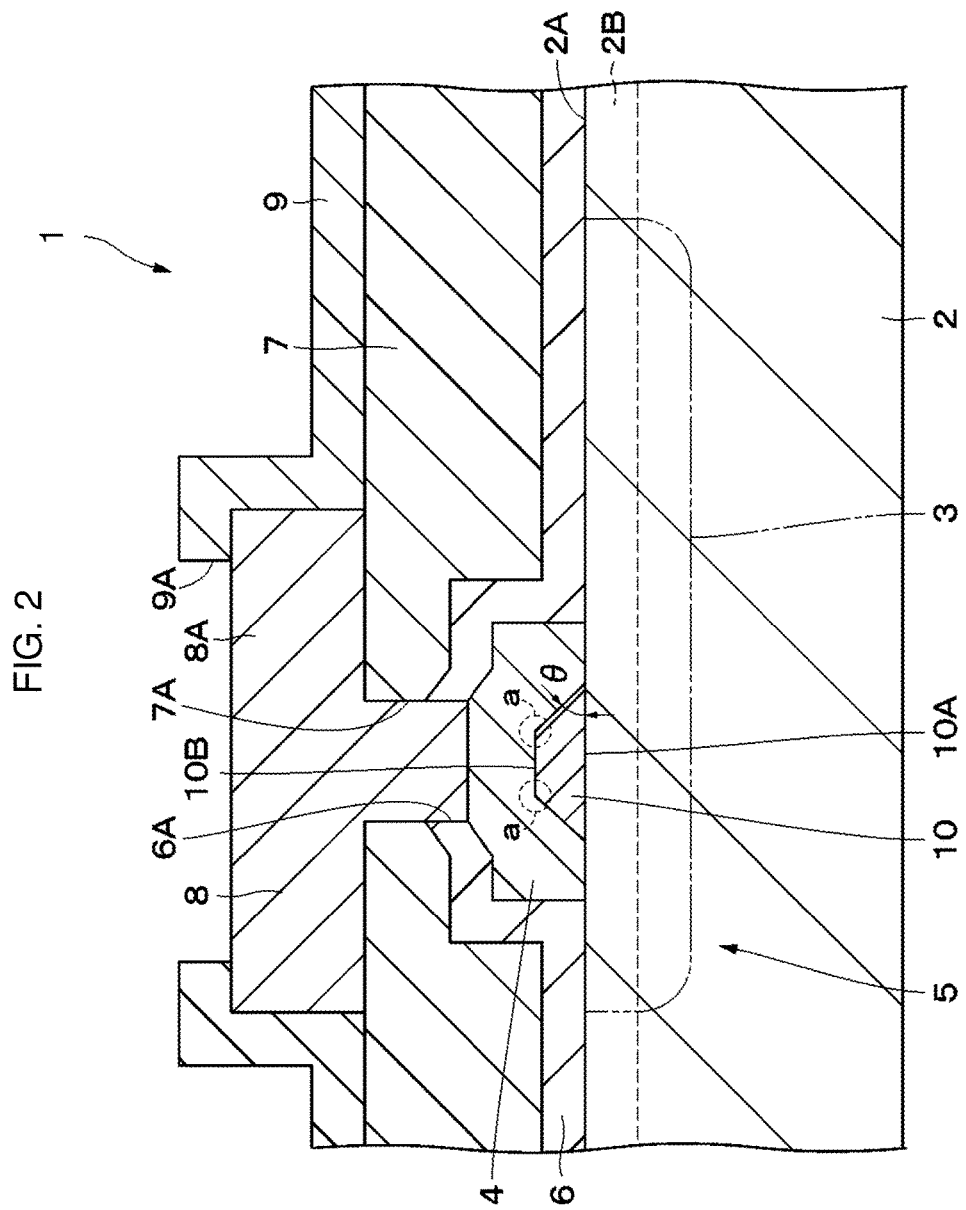
FIG. 2 is a partial enlarged sectional view of the semiconductor device according to the first embodiment.

FIGS. 1 and 2 illustrate a semiconductor device 1 according to a first embodiment. The semiconductor device 1 includes a semiconductor substrate 2, a first metal layer 4, an insulation layer 6, an organic layer 7, a second metal layer 8, and a patch portion 10. The first metal layer 4, the insulation layer 6, the organic layer 7, and the second metal layer 8 are sequentially stacked on a surface 2A of the semiconductor substrate 2.

The semiconductor substrate 2 is a planar substrate made of a semiconductor material, such as gallium arsenide (GaAs). Alternatively, the semiconductor substrate 2 may be made of another group III-V compound semiconductor, such as indium phosphide (InP) or gallium nitride (GaN). Further alternatively, the semiconductor substrate 2 may be made of a group II-VI compound semiconductor, such as zinc selenide (ZnSe), or a group IV compound semiconductor, such as silicon carbide (SiC) or silicon germanium (SiGe). Instead of a compound semiconductor, the semiconductor substrate 2 may be made of a group IV semiconductor, such as silicon (Si) or germanium (Ge).

A semiconductor layer 2B, which is made of gallium arsenide (GaAs), aluminium gallium arsenide (AlGaAs), or the like, is formed on the surface 2A of the semiconductor substrate 2. The semiconductor layer 2B may be doped with impurities or may be free from impurities. The semiconductor layer 2B may consist of one layer or a plurality of layers (for example, two layers).

A semiconductor element 3 is disposed in or on the semiconductor substrate 2 at a position near the surface 2A. For example, the semiconductor element 3 is formed so as to include a part of the semiconductor layer 2B. The semiconductor element 3 may be an active element, such as a diode or a field-effect transistor, or a passive element, such as a resistor or a capacitor. In general, a plurality of semiconductor elements 3 are disposed in or on the semiconductor substrate 2 (although only one of them is shown in the figures). The plurality of semiconductor element 3 are electrically connected to each other through at least one of the first metal layer 4 and the second metal layer 8.

The first metal layer 4 is disposed closer than the organic layer 7 to the semiconductor substrate 2. To be specific, the first metal layer 4 is formed on the surface 2A of the semiconductor substrate 2. The first metal layer 4 is made of an electroconductive metal material, such as gold (Au). The first metal layer 4 has various functions, such as a function of forming electrodes of the semiconductor element 3 and a function of electrically connecting a plurality of semiconductor elements 3 to each other. As a result, a circuit 5 (such as an amplifier circuit) including the semiconductor elements 3 is formed in or on the semiconductor substrate 2. Therefore, the semiconductor substrate 2 is a circuit substrate in which the circuit 5 is formed.

The insulation layer 6 is formed on the surface 2A of the semiconductor substrate 2 so as to cover the semiconductor element 3. The insulation layer 6 is an inorganic insulation layer. The insulation layer 6 is made of an insulating inorganic material, such as a silicon nitride film. A via 6A, which is a through-hole, is formed in the insulation layer 6 at a position corresponding to, for example, the position of the first metal layer 4. The insulation layer 6 is an interlayer insulation layer that electrically insulates the surface 2A of the semiconductor substrate 2 and the second metal layer 8 from each other.

The insulation layer 6 may be, instead of a silicon nitride (such as $Si_3N_4$ or SiN) film, a silicon oxide (such as $SiO_2$ or SiO) film or a silicon oxynitride (such as SiON) film.

The organic layer 7 is formed over the semiconductor substrate 2 so as to cover the insulation layer 6. The organic layer 7 is an interlayer insulation layer, as with the insulation layer 6. The organic layer 7 is an organic insulation layer. The organic layer 7 is made of an insulating organic material, such as polyimide resin (PI), benzocyclobutene (BCB), or polybenzoxazole (PBO). The organic layer 7 is formed by spin coating the surface of the insulation layer 6 with such a resin material. The thickness of the organic layer 7 tends to become larger than the thickness of the insulation layer 6. For example, the organic layer 7 functions to flatten the entirety of the surface of the semiconductor device 1 and to reduce the interlayer capacitance between the first metal layer 4 and the second metal layer 8.

A via 7A, which is a through-hole, is formed in the organic layer 7 at a position corresponding to the position of the first metal layer 4. The via 7A is a hollow portion of the organic layer 7. The via 7A is disposed at a position corresponding to the position of the via 6A. Therefore, if the second metal layer 8 is omitted, the surface of the first metal layer 4 is exposed in the via 7A. The sizes (opening areas) of the vias 6A and 7A need not be the same but may differ from each other. For example, the via 7A of the organic layer 7 may be larger than the via 6A of the insulation layer 6.

The second metal layer 8 is disposed farther than the organic layer 7 from the semiconductor substrate 2. The second metal layer 8 is another metal layer that is not in contact with the semiconductor substrate 2. The second metal layer 8 is disposed on the surface of the organic layer 7. The second metal layer 8 is made of, for example, an electroconductive metal material. The second metal layer 8 has various functions, such as a function of electrically connecting the semiconductor element 3 to the outside via the first metal layer 4. Therefore, the second metal layer 8 is electrically connected to the first metal layer 4 through the vias 6A and 7A. The second metal layer 8 includes an electrode pad 8A at a position corresponding to the positions of the vias 6A and 7A. The surface of the electrode pad 8A is exposed so that the electrode pad 8A can be connected to the outside by wire bonding or the like.

A passivation film 9 is disposed on or over the semiconductor substrate 2 so as to cover the second metal layer 8. The passivation film 9 covers not only the second metal layer 8 but also the organic layer 7, the semiconductor layer 2B, and the like. The passivation film 9 is made of an insulating inorganic material, such as a silicon nitride film, a silicon oxide film, or a silicon oxynitride film. The passivation film 9 has an opening 9A, which allows the electrode pad 8A to be exposed, at a position corresponding to the position of the electrode pad 8A.

The patch portion 10 is disposed in a region between the surface 2A of the semiconductor substrate 2 and the via 7A of the organic layer 7 in the thickness direction. To be specific, the patch portion 10 is disposed at the interface between the semiconductor substrate 2 and the first metal layer 4. In this case, the patch portion 10 is in contact with the semiconductor substrate 2 and the first metal layer 4 in a state in which the patch portion 10 is interposed between the semiconductor substrate 2 and the first metal layer 4. The patch portion 10 is made of, for example, a material that is the same as the material of the semiconductor substrate 2 or the first metal layer 4. To be specific, the patch portion 10 is made of an electroconductive metal material, or a semiconductor material that is the same as the material of the semiconductor substrate 2.

The patch portion 10 has a planar shape (such as a circular shape, an elliptical shape, or a quadrangular shape) that is the same as the shape of the opening of the via 7A. The patch portion 10 has a trapezoidal cross-sectional shape, and the area of a bottom surface 10A of the patch portion 10 is larger than the area of an upper surface 10B of the patch portion 10. The angle between a base and a lateral side of the trapezoidal cross-sectional shape of the patch portion 10 is in the range of 20° to 70°. Preferably, the angle is in the range of 30° to 60°. The area of the bottom surface 10A of the patch portion 10 is larger than the opening area of the via 7A. The patch portion 10 raises the first metal layer 4, which serves as the bottom of the via 7A, at the position of the via 7A.

The area of the bottom surface 10A of the patch portion 10 may be smaller than the opening area of the via 7A. In consideration of tolerance of displacement between the patch portion 10 and the via 7A, preferably, the area of the bottom surface 10A of the patch portion 10 is, for example, larger than or equal to the opening are of the via 7A and smaller than three times the opening area of the via 7A.

The shape and size of the patch portion 10 may be substantially the same as those of the opening of the via 7A. In this case, the bottom surface 10A of the patch portion 10 may be larger than the opening area of the via 7A, and the upper surface 10B of the patch portion 10 may be smaller than the opening area of the via 7A.

As described above, according the first embodiment, the patch portion 10 is disposed in a region between the surface 2A of the semiconductor substrate 2 and the via 7A of the organic layer 7 in the thickness direction. To be specific, the patch portion 10 is disposed at the interface between the semiconductor substrate 2 and the first metal layer 4. Therefore, the patch portion 10 can raise the surface of the first metal layer 4, which serves as the bottom of the via 7A. Thus, when the second metal layer 8 is formed so as to fill the via 7A, a depression in the surface of the second metal layer 8 can be made shallower.

The second metal layer 8 includes the electrode pad 8A having a surface exposed at a position corresponding to the position of the via 7A of the organic layer 7. Therefore, the surface of the electrode pad 8A can be flattened, and poor connection of a wire can be reduced when wire bonding is performed on the electrode pad 8A.

If the patch portion 10 has a rectangular cross-sectional shape, the angle of a corner of the cross section is about 90°. In this case, when the first metal layer 4 is formed so as to cover the patch portion 10, the first metal layer 4 is not likely to be appropriately formed at a corner "a" of the cross section. Thus, step coverage may deteriorate, and a defect may occur in the first metal layer 4.

In contrast, the patch portion 10 according to the present embodiment has a trapezoidal cross-sectional shape. The angle θ between a base and a lateral side of the trapezoidal cross-sectional shape of the patch portion 10 is in the range of 20° to 70°. Therefore, the angle of the corner "a" of the cross section of the patch portion 10 is an obtuse angle larger than 90°. Thus, when the first metal layer 4 is formed so as to cover the patch portion 10, the first metal layer 4 can be continuously formed without a gap. As a result, the occurrence of a defect in the first metal layer 4 is suppressed, and the reliability can be increased.

Moreover, since the area of the bottom surface of the patch portion 10 is larger than the opening area of the via 7A, the patch portion 10 can raise the entirety of the bottom of the via 7A. Therefore, in the entirety of a region corresponding to the via 7A, a depression in the surface of the second metal layer 8 can be made shallower.

Figure 3:
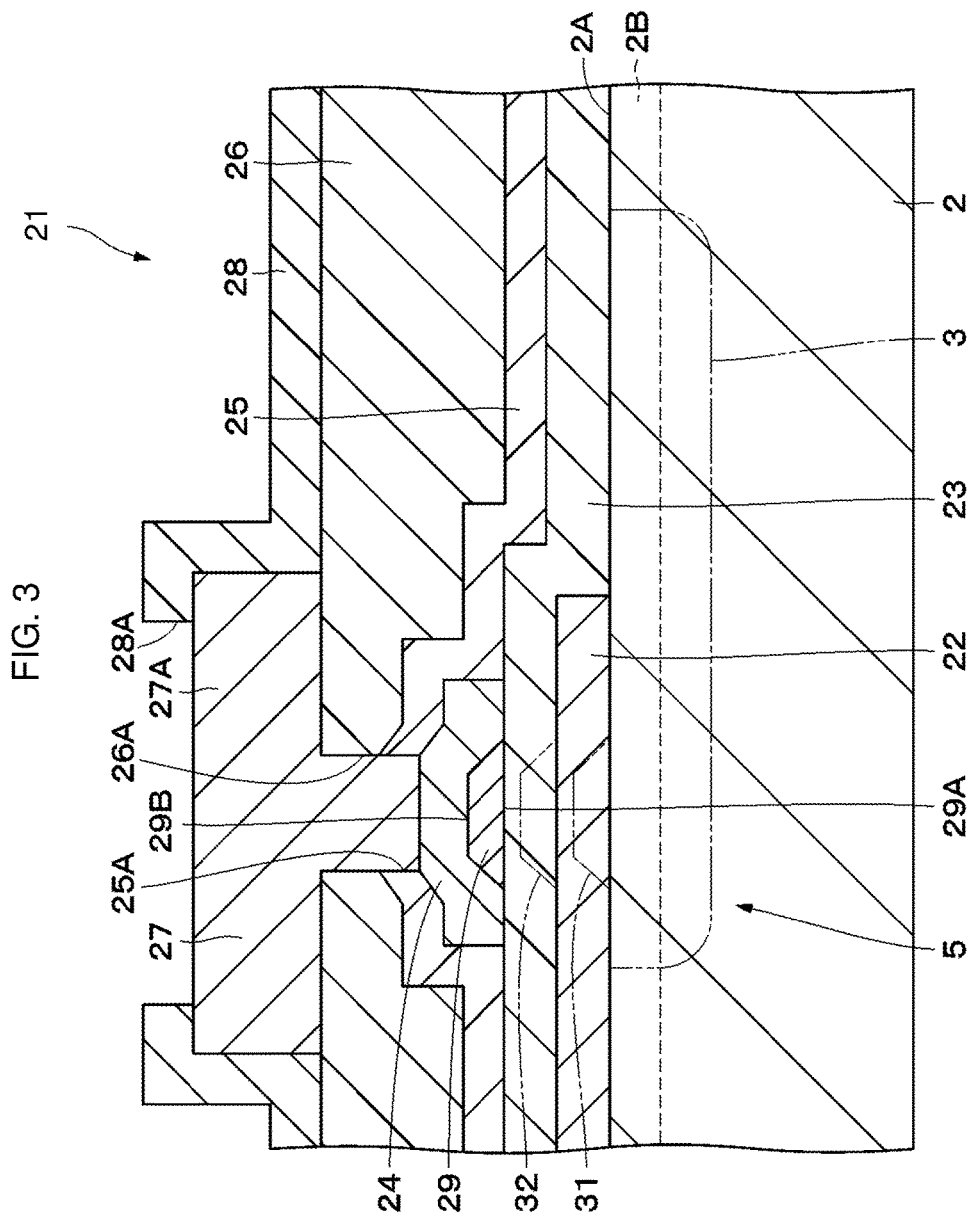
FIG. 3 is a partial enlarged sectional view of the semiconductor device according to a second embodiment.

FIG. 3 illustrates a semiconductor device 21 according to a second embodiment of the present disclosure. The semiconductor device 21 is characterized in including a plurality of first metal layers and a plurality of insulation layers. In the following description, elements of the semiconductor device 21 that are the same as those of the semiconductor device 1 according to the first embodiment 1 will be denoted by the same numerals and descriptions of such elements will be omitted.

The semiconductor device 21 includes a semiconductor substrate 2, first metal layers 22 and 24, insulation layers 23 and 25, an organic layer 26, and a second metal layer 27. A semiconductor layer 2B is formed on a surface 2A of the semiconductor substrate 2.

The first metal layer 22 is a metal layer adjacent to the semiconductor substrate 2 and formed on the surface 2A of the semiconductor substrate 2. The first metal layer 22 is substantially the same as the first metal layer 4 according to the first embodiment, and is made of, for example, an electroconductive metal material. The first metal layer 22 has various functions, such as a function of forming electrodes of a semiconductor element 3 and a function of electrically connecting a plurality of semiconductor elements 3 to each other. As a result, a circuit 5 including the semiconductor elements 3 is formed in or on the semiconductor substrate 2.

The insulation layer 23 is formed on the surface 2A of the semiconductor substrate 2 so as to cover the semiconductor element 3. The insulation layer 23 is an inorganic insulation layer. The insulation layer 23 is substantially the same as the insulation layer 6 according to the first embodiment, and is made of an insulating inorganic material, such as silicon nitride. The insulation layer 23 is an interlayer insulation layer that electrically insulates the first metal layer 22 and the other first metal layer 24 from each other.

The other first metal layer 24 is formed on the surface of the insulation layer 23. The first metal layer 24 is made of, for example, an electroconductive metal material. The first metal layer 24 has various functions, such as a function of electrically connecting the first metal layer 22 and the second metal layer 27 to each other and a function of electrically connecting a plurality of semiconductor elements 3 to each other across the first metal layer 22.

The other insulation layer 25 is formed on the surface 2A of the semiconductor substrate 2 so as to cover the semiconductor element 3. The insulation layer 25 is an inorganic insulation layer, as with the insulation layer 23. Therefore, the insulation layer 25 is substantially the same as the insulation layer 6 according to the first embodiment, and is made of an insulating inorganic material, such as a silicon nitride film. A via 25A, which is a through-hole, is formed in the insulation layer 25 at a position corresponding to, for example, the position of the first metal layer 24. The insulation layer 25 is an interlayer insulation layer and electrically insulates the first metal layer 24 and the second metal layer 27 from each other.

The organic layer 26 is formed over the semiconductor substrate 2 so as to cover the insulation layer 25. The organic layer 26 is an interlayer insulation layer, as with the insulation layers 23 and 25. The organic layer 26 is an organic insulation layer. The organic layer 26 is made of an insulating organic material, as with the organic layer 7 according to the first embodiment. The thickness of the organic layer 26 tends to become larger than the thickness of the insulation layers 23 and 25. The organic layer 26 has a function of, for example, flattening the entirety of the surface of the semiconductor device 21, and a function of reducing the interlayer capacitance between the first metal layers 22 and 24 and the second metal layer 27. A via 26A, which is a through-hole, is formed in the organic layer 26 at a position corresponding to the position of the first metal layer 24. The via 26A is disposed at a position corresponding to the position of the via 25A. Therefore, if the second metal layer 27 is omitted, the surface of the first metal layer 24 is exposed in the via 26A. The sizes (opening areas) of the vias 25A and 26A need not be the same and may differ from each other. For example, the via 26A of the organic layer 26 may be larger than the via 25A of the insulation layer 25.

The second metal layer 27 is another metal layer that is not in contact with the semiconductor substrate 2. The second metal layer 27 is disposed on the surface of the organic layer 26 and over the semiconductor substrate 2. The second metal layer 27 is made of, for example, an electroconductive metal material. The second metal layer 27 has various functions, such as a function of electrically connecting the semiconductor element 3 to the outside with the first metal layers 22 and 24 therebetween. The second metal layer 27 is electrically connected to the first metal layer 24 through the vias 25A and 26A. The second metal layer 27 includes an electrode pad 27A at a position corresponding to the positions of the vias 25A and 26A. The surface of the electrode pad 27A is exposed so that the electrode pad 27A can be connected to the outside by wire bonding or the like.

A passivation film 28 is disposed on or over the semiconductor substrate 2 so as to cover the second metal layer 27. The passivation film 28 covers not only the second metal layer 27 but also the organic layer 26, the semiconductor layer 2B, and the like. The passivation film 28 is made of an insulating inorganic material, such as a silicon nitride film, a silicon oxide film, or a silicon oxynitride film. The passivation film 28 has an opening 28A, which allows the electrode pad 27A to be exposed, at a position corresponding to the position of the electrode pad 27A.

A patch portion 29 is substantially the same as the patch portion 10 according to the first embodiment. That is, the patch portion 29 is disposed in a region between the surface 2A of the semiconductor substrate 2 and the via 26A of the organic layer 26 in the thickness direction. To be specific, the patch portion 29 is disposed at the interface between the insulation layer 23 and the first metal layer 24. In this case, the patch portion 29 is in contact with the insulation layer 23 and the first metal layer 24 in a state in which the patch portion 29 is interposed between the insulation layer 23 and the first metal layer 24. The patch portion 29 is made of, for example, a material that is the same as the material of the insulation layer 23 or the first metal layer 24. To be specific, the patch portion 29 is made of an electroconductive metal material or an insulating material.

The patch portion 29 has a trapezoidal cross-sectional shape, and the area of a bottom surface 29A of the patch portion 29 is larger than the area of an upper surface 29B of the patch portion 29. The angle between a base and a lateral side of the trapezoidal cross-sectional shape of the patch portion 29 is in the range of 20° to 70°. The area of the bottom surface 29A of the patch portion 29 is larger than the opening area of the via 26A. The patch portion 29 raises the first metal layer 24, which serves as the bottom of the via 26A, at the position of the via 26A.

Thus, the second embodiment has substantially the same advantageous effects as the first embodiment.

In the second embodiment, the patch portion 29 is disposed at the interface between the insulation layer 23 and the first metal layer 24. This is not a limitation on the present disclosure. The patch portion 29 may be disposed at any position in a region between the surface 2A of the semiconductor substrate 2 and the via 26A of the organic layer 26 in the thickness direction. Therefore, as shown by a two-dot chain line in FIG. 3, a patch portion 31 may be disposed at the interface between the semiconductor substrate 2 and the first metal layer 22, or a patch portion 32 may be disposed at the interface between the first metal layer 22 and the insulation layer 23.

In each of the embodiments described above, a single patch portion 10 or 29 is disposed between the surface 2A of the semiconductor substrate 2 and the via 7A or 26A of the organic layers 7 or 26 in the thickness direction. This is not a limitation on the present disclosure. A plurality of patch portions may be disposed in the thickness direction. That is, referring to FIG. 3, three patch portions 29, 31, and 32 may be disposed, or two of the three patch portions 29, 31, and 32 may be selectively disposed. When disposing a plurality of patch portions, the thicknesses or the outside dimensions of these patch portions may be the same as each other or differ from each other.

In each of the embodiments described above, the via 7A or 26A, which extends through the organic layer 7 or 26 in the thickness direction, is a hollow portion formed in the organic layer 7 or 26. This is not a limitation on the present disclosure. The hollow portion may be a blind hole that is formed in the organic layer and that does not extend through the organic layer in the thickness direction.

In each of the embodiments described above, the semiconductor device 1 or 21 is used, for example, as an electric power amplifier. However, this is not a limitation on the present disclosure. A semiconductor device according to an embodiment of the present disclosure may be used as a passive element such as a solar cell, a light-emitting element such as a laser diode (LD) or a light emitting diode (LED), or an optical sensor including both of a light-receiving element and a light-emitting element.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor substrate;
   a first metal layer;
   an inorganic insulation layer;
   an organic insulation layer; and
   a second metal layer,
   wherein the first metal layer, the inorganic insulation layer, the organic insulation layer, and the second metal layer are stacked on or over a surface of the semiconductor substrate,
   wherein the organic insulation layer includes a hollow portion and the hollow portion is a through-hole or a blind hole,
   wherein the semiconductor device further comprises a patch portion raising a bottom of the hollow portion, and the patch portion is disposed in a region between the surface of the semiconductor substrate and the hollow portion of the organic insulation layer in a thickness direction, and wherein the patch portion has a trapezoidal cross-sectional shape, and an area of a bottom surface of the patch portion is larger than an area of an upper surface of the patch portion.

2. The semiconductor device according to claim 1,
wherein an angle between a base and a lateral side of the trapezoidal cross-sectional shape of the patch portion is in a range of 20° to 70°.

3. The semiconductor device according to claim 2,
wherein the hollow portion is a through-hole, and
wherein the area of the bottom surface of the patch portion is larger than an opening area of the through-hole.

4. The semiconductor device according to claim 2,
wherein the second metal layer includes an electrode pad having a surface exposed at a position corresponding to a position of the hollow portion of the organic insulation layer.

5. The semiconductor device according to claim 1,
wherein the hollow portion is a through-hole, and
wherein the area of the bottom surface of the patch portion is larger than an opening area of the through-hole.

6. The semiconductor device according to claim 5,
wherein the second metal layer includes an electrode pad having a surface exposed at a position corresponding to a position of the hollow portion of the organic insulation layer.

7. The semiconductor device according to claim 1,
wherein the second metal layer includes an electrode pad having a surface exposed at a position corresponding to a position of the hollow portion of the organic insulation layer.

* * * * *